United States Patent
Jang et al.

(10) Patent No.: US 10,951,242 B2
(45) Date of Patent: Mar. 16, 2021

(54) METHOD AND APPARATUS FOR DESIGN OF PUNCTURED POLAR CODES

(71) Applicants: Samsung Electronics Co., Ltd., Suwon-si (KR); POSTECH ACADEMY-INDUSTRY FOUNDATION, Pohang-si (KR)

(72) Inventors: Min Jang, Suwon-si (KR); Jiwon Park, Pohang-si (KR); Kyeongcheol Yang, Pohang-si (KR); Daeyeol Yang, Pohang-si (KR); Hongsil Jeong, Suwon-si (KR)

(73) Assignees: Samsung Electronics Co., Ltd., Suwon-si (KR); POSTECH ACADEMY-INDUSTRY FOUNDATION 2, Pohang-si (KR)

( * ) Notice: Subject to any disclaimer, the term of this patent is extended or adjusted under 35 U.S.C. 154(b) by 0 days.

(21) Appl. No.: 16/453,097

(22) Filed: Jun. 26, 2019

(65) Prior Publication Data

US 2020/0036397 A1    Jan. 30, 2020

(30) Foreign Application Priority Data

Jul. 27, 2018    (KR) .......................... 10-2018-0087853

(51) Int. Cl.
*H03M 13/00* (2006.01)
*H04L 1/00* (2006.01)
*H03M 13/13* (2006.01)

(52) U.S. Cl.
CPC ....... *H03M 13/6362* (2013.01); *H03M 13/13* (2013.01); *H04L 1/0061* (2013.01); *H04L 1/0069* (2013.01)

(58) Field of Classification Search
None
See application file for complete search history.

(56) References Cited

U.S. PATENT DOCUMENTS 9,239,778 B2 * 1/2016 Lee ..................... H03M 13/1111
2018/0367239 A1 12/2018 Jang et al.

FOREIGN PATENT DOCUMENTS

KR    10-2018-0138101 A    12/2018

OTHER PUBLICATIONS (Bioglio et al), "Low-Complexity Puncturing and Shortening of Polar Codes"—Arvix (Jan. 2017) (Year: 2017).*

(Continued)

*Primary Examiner* — April Y Blair
*Assistant Examiner* — Matthew W Wahlin
(74) *Attorney, Agent, or Firm* — Jefferson IP Law, LLP

(57) ABSTRACT

A communication scheme and system for converging a $5^{th}$ generation (5G) communication system for supporting a data rate higher than that of a $4^{th}$ generation (4G) system with an internet of things (IoT) technology are provided. The present disclosure is applicable to intelligent services (e.g., smart home, smart building, smart city, smart car or connected car, health care, digital education, retail, and security and safety-related services) based on the 5G communication technology and the IoT-related technology. The disclosure relates to a punctured polar code design method and apparatus and proposes optimal puncturing pattern and information set selection criteria for designing punctured polar codes.

20 Claims, 12 Drawing Sheets

(56) References Cited

OTHER PUBLICATIONS (Shin et al), "Design of Length-Compatible Polar Codes based on the reduction of polarizing matrices"—IEEE (Jul. 2013) (Year: 2013).*

Erdal Arikan, "Channel Polarization: A Method for Constructing Capacity-Achieving Codes for Symmetric Binary-Input Memoryless Channels", IEEE Transactions on Information Theory, vol. 55, No. 7, Jul. 2009.

Kai Niu et al., "Beyond Turbo Codes: Rate-Compatible Punctured Polar Codes", Key Laboratory of Universal Wireless Communications, Ministry of Education Beijing University of Posts and Telecommunications, Beijing China, Jun. 9-13, 2013.

* cited by examiner

FIG. 6

| $p$ \ $N$ | 64 | 128 | 256 |
|---|---|---|---|
| N/32 | 1 | 2 | 6 |
| N/16 | 2 | 6 | 36 |
| N/8 | 5 | 27 | 540 |
| N/4 | 17 | 208 | 13754 |

FIG. 7

| (N, K, p, $E_s/N_0$ [dB]) | QUP | Proposed |
|---|---|---|
| (64,33,14,2.0) | $4.302 \times 10^{-2}$ | $4.080 \times 10^{-2}$ |
| (65,15,14,2.0) | $1.466 \times 10^{-6}$ | $7.874 \times 10^{-7}$ |
| (128,45,32,3.0) | $7.449 \times 10^{-6}$ | $5.219 \times 10^{-6}$ |

METHOD AND APPARATUS FOR DESIGN OF PUNCTURED POLAR CODES

CROSS-REFERENCE TO RELATED APPLICATION(S)

This application is based on and claims priority under 35 U.S.C. § 119(a) of a Korean patent application number 10-2018-0087853, filed on Jul. 27, 2018, in the Korean Intellectual Property Office, the disclosure of which is incorporated by reference herein in its entirety.

JOINT RESEARCH AGREEMENT

The disclosure was made by or on behalf of the below listed parties to a joint research agreement. The joint research agreement was in effect on or before the date the disclosure was made and the disclosure was made as a result of activities undertaken within the scope of the joint research agreement. The parties to the joint research agreement are 1) SAMSUNG ELECTRONICS CO., LTD., and 2) POSTECH ACADEMY-INDUSTRY FOUNDATION.

BACKGROUND

1. Field

The disclosure relates to an error control technology. More particularly, the disclosure relates to a method and apparatus for designing punctured polar codes.

2. Description of Related Art

To meet the increased demand for wireless data traffic since the deployment of 4th generation (4G) communication systems, efforts have been made to develop an improved $5^{th}$ generation (5G) or pre-5G communication system. Therefore, the 5G or pre-5G communication system is also called a "Beyond 4G Network" or a "Post long term evolution (LTE) System".

Implementation of the 5G communication system in higher frequency millimeter wave (mmWave) bands, e.g., 60 GHz bands, is being considered in order to accomplish higher data rates. To decrease the propagation loss of radio waves and increase the transmission distance, beamforming, massive multiple-input multiple-output (MIMO), Full Dimensional MIMO (FD-MIMO), array antenna, analog beam forming, and large scale antenna techniques are being discussed for the 5G communication system.

In addition, in the 5G communication system, there are developments under way for system network improvement based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation, and the like.

In the 5G system, Hybrid frequency shift keying (FSK) and quadrature amplitude modulation (QAM) Modulation (FQAM) and sliding window superposition coding (SWSC) as advanced coding modulation (ACM) and filter bank multi carrier (FBMC), non-orthogonal multiple access (NOMA), and sparse code multiple access (SCMA) as advanced access technology have been developed.

The Internet, which is a human centered connectivity network where humans generate and consume information, is now evolving into the Internet of Things (IoT) where distributed entities, such as things, exchange and process information without human intervention. The Internet of Everything (IoE), which is a combination of IoT technology and Big Data processing technology through connection with a cloud server, has emerged. As technology elements, such as "sensing technology", "wired/wireless communication and network infrastructure", "service interface technology", and "security technology" have been demanded for IoT implementation, recently there has been research into a sensor network, Machine-to-Machine (M2M) communication, Machine Type Communication (MTC), and so forth. Such an IoT environment may provide intelligent Internet technology services that create new values for human life by collecting and analyzing data generated among connected things. The IoT may be applied to a variety of fields including smart home, smart building, smart city, smart car or connected car, smart grid, health care, smart appliances, and advanced medical services through convergence and combination between existing Information Technology (IT) and various industrial applications.

In line with these developments, various attempts have been made to apply the 5G communication system to IoT networks. For example, technologies such as a sensor network, Machine Type Communication (MTC), and Machine-to-Machine (M2M) communication may be implemented by beamforming, MIMO, and array antennas. Application of a cloud Radio Access Network (RAN) as the above-described Big Data processing technology may also be considered to be an example of convergence between the 5G technology and the IoT technology.

Meanwhile, with the choice of polar codes as an error control technology for use in the next generation communication system, many discussions are being conducted on various methods for efficiently designing and using polar codes.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a method for designing a punctured polar code with superior successive cancellation (SC) and SC-list (SCL) decoding performances that is capable of improving an error rate performance of a communication system.

Additional aspects will be set forth in part in the description which follows and, in part, will be apparent from the description, or may be learned by practice of the presented embodiments.

In accordance with an aspect of the disclosure, a method of a transmitter is provided. The method includes determining incapable pattern based on a number of puncturing bits, determining a candidate of puncturing patterns comprising a puncturing pattern associated with the incapable pattern, selecting a puncturing pattern from the candidate of puncturing patterns and an information set based on a bit-channel reliability, and encoding an information bit with the puncturing pattern and the information set.

Preferably, determining the incapable pattern includes selecting an incapable pattern satisfying a combined partial order or selecting an incapable pattern satisfying one partial order. Here, the partial order is a superiority relationship defined, in various manners, between bit indices based on binary representations of bit indices. The combined partial order is a partial order obtained by combining partial orders defined in two or more different schemes. Of course, it is also possible to determine the incapable patterns with an individual partial order.

Preferably, selecting the incapable pattern satisfying the combined partial order includes determining an incapable pattern satisfying a first partial order and determining an incapable pattern satisfying a second partial order among the incapable pattern satisfying the first partial order or selecting the incapable patterns satisfying one of the partial orders.

Preferably, selecting the incapable pattern includes searching all of the incapable pattern determined based on the number of puncturing bits for the incapable pattern satisfying the combined partial order.

Preferably, the puncturing pattern belonging to the candidate of puncturing patterns includes a symmetric puncturing pattern having a reciprocal relationship with the incapable pattern.

Preferably, the reciprocal relationship includes a one-to-one relationship.

Preferably, selecting the puncturing pattern includes selecting a puncturing pattern in which a sum of reliabilities of least bit-channels computed with a density evolution technique is least.

Preferably, selecting the information set includes determining the information set with indices of bit-channels constituting the sum of the reliabilities of the least bit channels.

Preferably, encoding the information bits includes generating an encoded bit by encoding the information bit with the information set and puncturing the encoded bit with the puncturing pattern.

In accordance with another aspect of the disclosure, a transmitter is provided. The transmitter includes a transceiver configured to transmit and receive signals and a controller configured to determine incapable pattern based on a number of puncturing bits, determine a candidate of puncturing patterns comprising a puncturing pattern associated with the incapable pattern, select a puncturing pattern from the candidate of puncturing patterns and an information set based on bit-channel reliability, and encode an information bit with the puncturing pattern and the information set.

In accordance with another aspect of the disclosure, an encoding apparatus is provided. The encoding apparatus includes a transceiver configured to transmit and receive signals and a controller configured to generate an information bit, generate a coded bit by encoding the information bit, and transmit a punctured coded bit generated by puncturing the coded bit, the coded bit punctured with a puncturing pattern satisfies a partial order obtained by combining a first partial order and a second partial order being determined based on a binary representation relationship of bit-channel indices or satisfies one partial order.

Preferably, the first partial order is determined based on a bit position of 1 in the binary representation relationship, and the second partial order is determined based on a bit position of 0 in the binary representation relationship.

Preferably, the puncturing pattern is selected from a candidate of puncturing patterns related to an incapable pattern determined based on a number of puncturing bits and the puncturing pattern is selected based on bit-channel reliability in the candidate of puncturing patterns.

Preferably, the candidate of puncturing patterns includes a symmetric puncturing pattern having a reciprocal relationship with the incapable pattern, and the reciprocal relationship comprises a one-to-one relationship.

Preferably, the puncturing pattern is a puncturing pattern in which a sum of reliabilities of least bit-channels computed with a density evolution technique is least.

Preferably, the controller is configured to determine an information set with indices of bit-channels for a case where the sum of the reliabilities of the least bit-channels becomes least and encode the information bit to generate coded bit based on the information set.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6 is a diagram illustrating a table exemplifying a number of incapable patterns satisfying a combined partial order for use in designing punctured polar codes according to an embodiment of the disclosure;

FIG. 7 is a diagram illustrating a table exemplifying bit-channel reliabilities of polar codes punctured with symmetric puncturing patterns computed through a punctured polar code design procedure according to an embodiment of the disclosure;

Throughout the drawings, it should be noted that like reference numbers are used to depict the same or similar elements, features, and structures.

DETAILED DESCRIPTION

Figure 1:
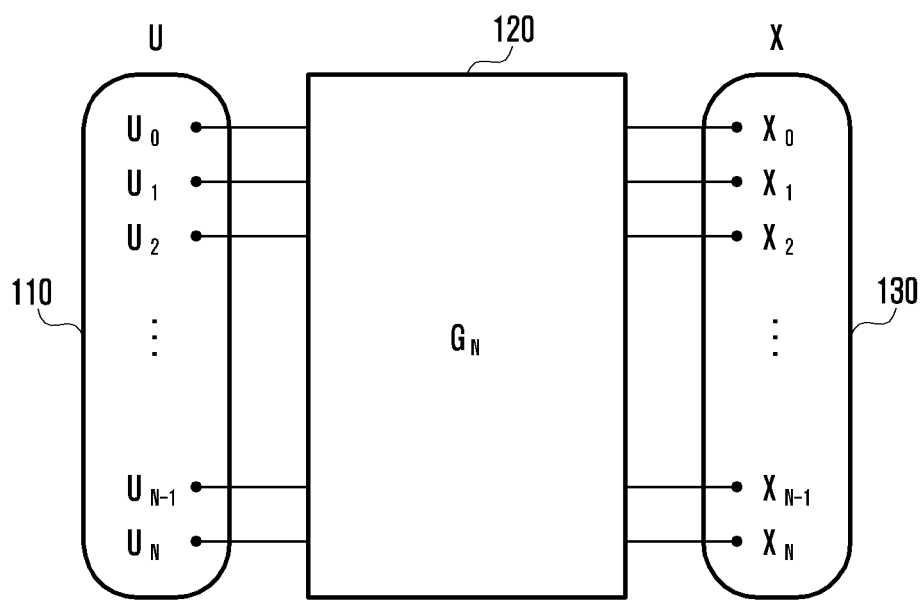
FIG. 1 is a diagram for explaining a polar code under consideration according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Detailed descriptions of technical specifications well-known in the art and unrelated directly to the disclosure may be omitted to avoid obscuring the subject matter of the disclosure. This aims to omit unnecessary description so as to make clear the subject matter of the disclosure.

For the same reason, some elements are exaggerated, omitted, or simplified in the drawings and, in practice, the elements may have sizes and/or shapes different from those shown in the drawings. Throughout the drawings, the same or equivalent parts are indicated by the same reference numbers.

Advantages and features of the disclosure and methods of accomplishing the same may be understood more readily by reference to the following detailed descriptions of various embodiments and the accompanying drawings. The disclosure may, however, be embodied in many different forms and should not be construed as being limited to the various embodiments set forth herein; rather, these various embodiments are provided so that this disclosure will be thorough and complete and will fully convey the concept of the disclosure to those skilled in the art, and the disclosure will only be defined by the appended claims. Like reference numerals refer to like elements throughout the specification.

It will be understood that each block of the flowcharts and/or block diagrams, and combinations of blocks in the flowcharts and/or block diagrams, can be implemented by computer program instructions. These computer program instructions may be provided to a processor of a general-purpose computer, special purpose computer, or other programmable data processing apparatus, such that the instructions that are executed via the processor of the computer or other programmable data processing apparatus create a specific device for implementing the functions/acts specified in the flowcharts and/or block diagrams. These computer program instructions may also be stored in a non-transitory computer-readable memory that can direct a computer or other programmable data processing apparatus to function in a particular manner, such that the instructions stored in the non-transitory computer-readable memory produce articles of manufacture embedding instruction means that implement the function/act specified in the flowcharts and/or block diagrams. The computer program instructions may also be loaded onto a computer or other programmable data processing apparatus to cause a series of operations to be performed on the computer or other programmable apparatus to produce a computer implemented process such that the instructions that are executed on the computer or other programmable apparatus provide operations for implementing the functions/acts specified in the flowcharts and/or block diagrams.

Furthermore, the respective block diagrams may illustrate parts of modules, segments, or codes including at least one or more executable instructions for performing specific logic function(s). Moreover, it should be noted that the functions of the blocks may be performed in a different order in several modifications. For example, two successive blocks may be performed substantially at the same time, or they may be performed in reverse order according to their functions.

According to various embodiments of the disclosure, the term "module", means, but is not limited to, a software or hardware component, such as a Field Programmable Gate Array (FPGA) or Application Specific Integrated Circuit (ASIC), which performs certain tasks. A module may advantageously be configured to reside on the addressable storage medium and configured to be executed on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionalities of the components and modules may be combined into fewer components and modules or further separated into more components and modules. In addition, the components and modules may be implemented such that they execute one or more central processing units (CPUs) in a device or a secure multimedia card.

FIG. 1 is a diagram for explaining a polar code under consideration according to an embodiment of the disclosure.

The polar code proposed by E. Arikan is an error correction code that has been theoretically proved to achieve the channel capacity. Information bits are encoded by a polar code encoder to produce coded bits; referring to FIG. 1, $G_N$ denotes a polar code encoder 120 of length N. In the following description, a set of information bits 110 input to the polar code encoder 120 is referred to as domain u, and a set of coded bits 130 output from the polar code encoder 120 is referred to as domain x. The information bits $u_i$ (i=0, 1, 2, ..., N) as a bit sequence of length N are multiplied by a generator matrix $G_N$ to produce encoded bits $x_i$ (i=0, 1, 2, ..., N) as a bit sequence of length N. This bit sequence x is referred to as a mother code of the polar code. Meanwhile, a polar code of length $N=2^n$ is linear block code with a generator matrix of Equation 1 as follows.

$$G_N = B_N F^{\otimes n} \quad \text{Equation 1}$$

In Equation 1, $B_N$ denotes a bit-reversal permutation matrix of size N×N, $$F = \begin{bmatrix} 1 & 0 \\ 1 & 1 \end{bmatrix},$$

and $\otimes$ denotes a Kronecker product operation. An information set A is defined as a set of size K as a subset of indices of rows of $G_N$. A polar codeword c for an information vector $u_A$ is calculated by Equation 2 as follows.

$$c = u_A G_N \quad \text{Equation 2}$$

When information set A is given, $u_A$ typically allocates information to bit positions corresponding to K elements belonging to the set A and frozen value of 0 to the remaining N-Kbit positions.

It may also be possible to use a generator matrix including a no bit-reversal permutation matrix as Equation 3 instead of the generator matrix of Equation 1. Because the bit-reversal permutation matrix just plays a role of performing bit-reversal permutation on one of coded input and output bits, the encoding/decoding operation or performance and complexity do not depend on whether or not the bit-reversal permutation matrix is considered.

$$G_N = F^{\otimes n} \qquad \text{Equation 3}$$

Meanwhile, the produced bit sequence x of length N is interleaved for code rate adjustment, and the interleaved bit sequence is stored in a virtual circular buffer of length N. From the buffer, M bits are sequentially loaded to be transmitted; if M<N, N-M bits are punctured in reverse order of being stored in the buffer. If M>N, M-N bits are repetitively transmitted in order of being stored in the buffer.

Considering that the code length N of the polar code is in the form of power of 2, a puncturing and shortening may be implemented to use polar codes in a communication system designed to support various code lengths. Niu et al. have proposed a method for design of punctured polar codes using a quasi-uniform puncturing (QUP) pattern. Although a polar code demonstrates typically superior performance, the polar code punctured with the QUP pattern does not lead to optimal performance with a given code rate and punctured code length.

In order to design punctured polar codes with an optimal performance, equivalent classes of all puncturing patterns may be considered. However, considering that the number of equivalent classes increases abruptly as the code length N increases, there is a need of criteria for selecting a set of candidate puncturing patterns. There is also a need of clear criteria for determining the best puncturing pattern among the candidate puncturing patterns and an information set.

Meanwhile, in order to determine the information set of a polar code, the reliability of bit-channels $W_N^{(i)}$, $i \in Z_N$ is calculated. Typically, the reliability of bit-channels varies according to the channel condition, while the bit-channel pair having a combined partial order relationship is upgraded and degraded regardless of the channel condition.

The combined partial order is determined by a binary relationship of two bit-channel indices and, in detail, a combination of partial order 1 (PO1) and partial order 2 (PO2). Suppose that the indices of the two bit-channels are i and k (i<j), which are respectively expressed as binary representations of $(i_{n-1}, \ldots, i_0)$ and $(j_{n-1}, \ldots, j_0)$, when there are l and l' satisfying $j_l=0$, $j_{l'}=1$, $i_l=1$, $i_{l'}=0$, $1<l'$, and $i_k=j_k$, $\forall k \in Z_n$ 1 $\{l,l'\}$, the two bit-channels $W_N^{(i)}$ and $W_N^{(j)}$ have a relationship of partial order 1, which may be expressed as Equation 4.

$$W_N^{(i)} \preceq_1 W_N^{(j)} \qquad \text{Equation 4}$$

In the case of Equation 4, if the statistical characteristics of the bit-wise channels experienced by the respective coded output bits are identical with each other, the bit-channel $W_N^{(j)}$ is more enhanced than the bit-channel $W_N^{(i)}$. If $j_k i_k = j_k$ and $\forall k \in Z_n$ are satisfied, the two bit-channels have a relationship of partial order 2, which may be expressed as Equation 5.

$$W_N^{(i)} \preceq_2 W_N^{(j)} \qquad \text{Equation 5}$$

In the case of Equation 5, bit-channel $W_N^{(j)}$ is always more enhanced than bit-channel $W_N^{(i)}$ regardless of the bit-wise channel conditions experienced by the coded output bits. Both the partial orders 1 and 2 are transitive relationships; if it is possible to show that the bit-channel $W_N^{(j)}$ is more enhanced than the bit-channel $W_N^{(i)}$ regardless of the conditions by combining the two partial orders, the two bit-channels are in a combined partial order relationship, which may be expressed as Equation 6. Here, the transitive relationship means a relationship satisfying $a \preceq c$ if $a \preceq b$ and $b \preceq c$.

$$W_N^{(i)} \preceq_C W_N^{(j)} \qquad \text{Equation 6}$$

Using the combined partial order relationship, it is possible to reduce the polar code design complexity. However, considering that the combined partial order relationship is typically not maintained when the polar code is punctured, it is not easy to use such a combined partial order relationship in designing punctured polar codes.

Figure 2:
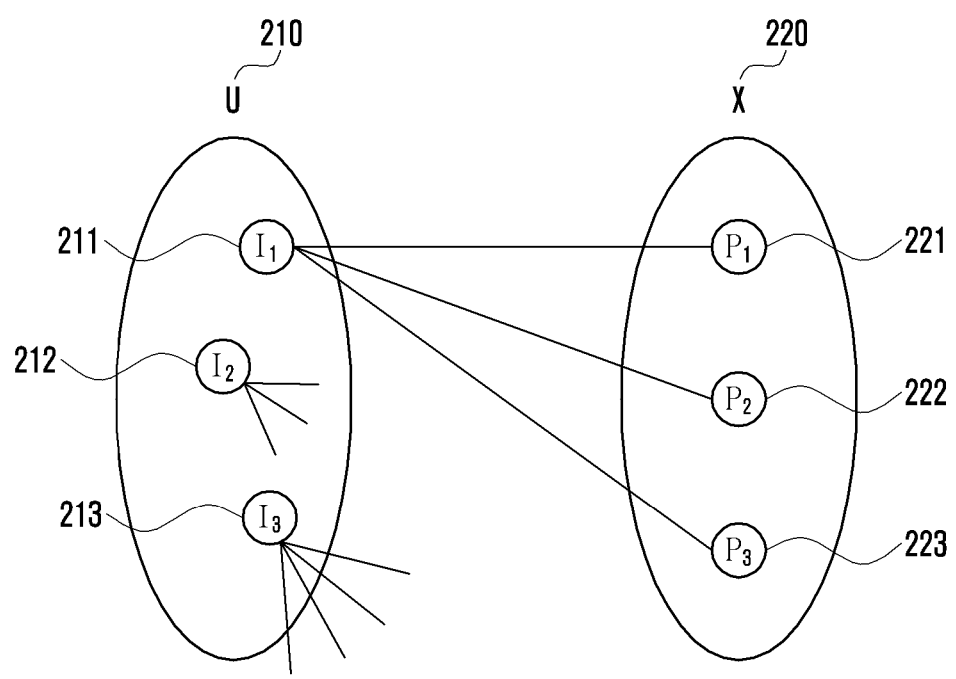
FIG. 2 is a diagram for explaining an incapable pattern and a puncturing pattern of polar codes being considered according to an embodiment of the disclosure.

FIG. 2 is a diagram for explaining an incapable pattern and a puncturing pattern of polar codes being considered according to an embodiment of the disclosure.

In the case of punctured polar codes, a codeword being punctured has an index corresponding to a zero element in a puncturing pattern $P \varepsilon \{0,1\}^N$. In the case of puncturing a polar code with the puncturing pattern P, some bit-channels as many as a number of punctured bits become incapable, and incapable bits denote the bit-channels that cannot be used because of being punctured among the bit-channels input as the polar code. The indices of the incapable bit-channels correspond to the positions of zero elements in an incapable pattern $E[P] \varepsilon \{0,1\}^N$.

Referring to FIG. 2, multiple puncturing patterns $P_i$ (i=1, 2, . . . ) are shown in domain x 220, and the puncturing patterns 221, 222, and 223 have each predetermined puncturing bits for puncturing a polar code of length N. Although the puncturing patterns have an identical number of puncturing bits, they may correspond to different incapable patterns according to an order of puncturing bits. In the embodiment of FIG. 2, the puncturing patterns P1, P2, and P3 correspond to a specific incapable pattern $I_i$ among multiple incapable patterns $I_i$ 211 (i=1, 2, . . . ) in domain u 210. Other incapable patterns $I_2$ 212 and $I_3$ 213 may also correspond to respective puncturing patterns in such a way that one incapable pattern is associated with one or more puncturing patterns.

A puncturing pattern P satisfying Equation 7 is defined as a symmetric puncturing pattern, and the symmetric puncturing pattern is correlated with an incapable pattern E[P].

$$E[P] = B_N P \qquad \text{Equation 7}$$

For example, a specific incapable pattern E[P] and a symmetric puncturing pattern P correlated therewith may have a one-to-one correlation, but the correlation is not limited thereto. That is, although the description is directed to a one-to-one relationship between a symmetric puncturing pattern and an incapable pattern for convenience of explanation, different symmetric puncturing patterns may be correlated with one incapable pattern. In the following description, the term "symmetric puncturing pattern" may be intended to mean a reciprocal relationship between an incapable pattern and a puncturing pattern.

In the following description, if the upgrade and degrade relationship of two arbitrary bit-channels having a combined partial order relationship in the legacy polar codes is maintained under the assumption that an incapable pattern of a punctured polar code is a reliability vector of the bit-channels, it is expressed that the incapable pattern satisfies the combined partial order. If an incapable pattern satisfies a combined partial order, this means that the incapable pattern is organized to satisfy the incapable pattern.

In the following embodiment, a method for selecting a set of candidate puncturing patterns for designing punctured polar codes with a superior performance is proposed. A method for selecting a puncturing pattern among the candidate puncturing patterns and an information set is also proposed. In the proposed methods, it may be possible to make a full search for incapable patterns satisfying a combined partial order and compute symmetric puncturing patterns corresponding thereto to select the candidate puncturing patterns. A method for obtaining bit-channel reliabilities of polar codes punctured with the computed symmetric puncturing pattern and designing punctured polar codes with a superior error rate performance based on the bit-channel reliabilities is also provided.

Figure 3:
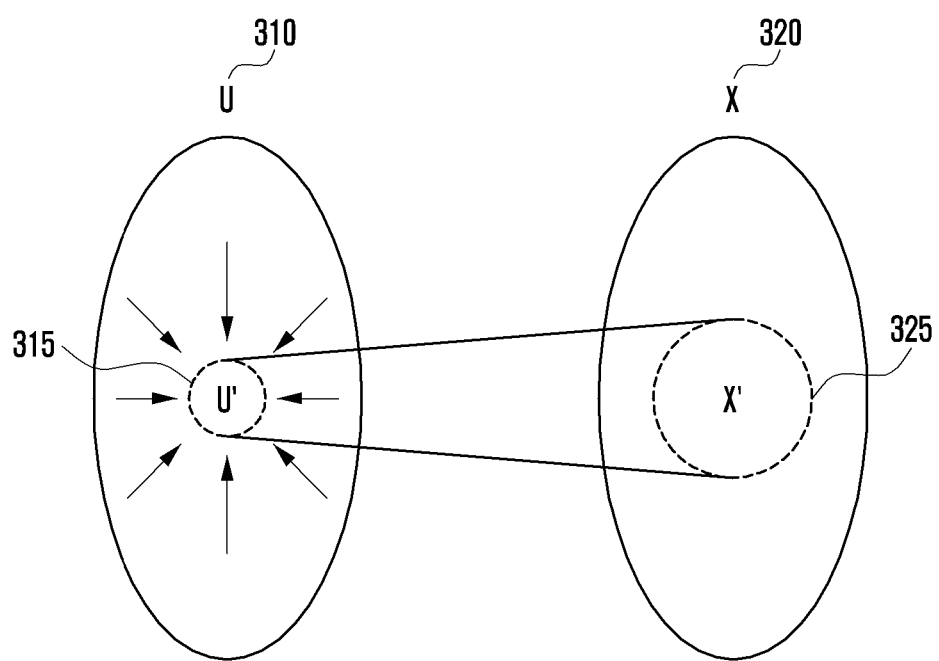
FIG. 3 is a diagram for explaining a procedure for determining a set of candidate puncturing patterns according to an embodiment of the disclosure.

FIG. 3 is a diagram for illustrating aspects of a procedure for determining a set of candidate puncturing patterns according to an embodiment of the disclosure.

In order to help understand how to select a set of candidate puncturing patterns among a plurality of puncturing patterns defined according to a predetermined number of puncturing bits in domain x 320, a description is made of a method for use of symmetric patterns correlated with incapable patterns along with the embodiment of the incapable patterns satisfying a combined partial order.

Referring to FIG. 3, an example is illustrated of selecting a set of incapable patterns u' 315 among all incapable patterns determined according to a number of puncturing bits in domain u 310. If an incapable pattern satisfies a combined partial order, this may mean that the upgrade and degrade relationship between two arbitrary bit-channels satisfies the relationship of Equation 6 as described above. In particular, considering that a number of incapable patterns corresponding to a predetermined number of puncturing bits abruptly increases as the length N of the polar code increases, a procedure for selecting incapable patterns satisfying both the partial orders 1 and 2 among all the incapable patterns is sufficiently meaningful. By reducing the number of incapable patterns for an arbitrary number of puncturing bits based on the fact of satisfying a combined partial order, a transmitter may make a full search for incapable patterns satisfying the combined partial order. Here, a set of some incapable patterns among all the incapable patterns may be determined by considering the partial orders 1 and 2 in a stepwise manner. For example, it may be possible to select some incapable patterns among all the incapable patterns in consideration of partial order 2 and, finally, select the incapable patterns satisfying partial order 1 among the incapable patterns satisfying partial order 2 or, of course, in reverse order.

If the incapable pattern set u' 315 is determined as above, it may also be possible to determine a set of puncturing patterns x' 325 corresponding to incapable patterns E[P] belonging to the incapable pattern set u' 315. That is, the puncturing pattern set may be determined as a set of incapable patterns satisfying Equation 7 in the incapable pattern set, and the puncturing patterns belonging to the puncturing pattern set may have a symmetric relationship or a reciprocal relationship with the incapable patterns.

If the candidate puncturing pattern set of puncturing patterns having symmetric relationships with the incapable patterns satisfying the combined partial order is established, the transmitter may calculate reliabilities of the polar codes punctured with the puncturing patterns belonging to the candidate puncturing pattern set to finally determine a punctured polar code for use in information bit transmission.

The above description has been directed to an example of determining incapable patterns based on a partial order obtained by combining partial orders defined using two or more different methods. However, it may of course be possible to determine an incapable pattern using an individual partial order without limitation to the above description. That is, the transmitter may determine an incapable pattern with the aforementioned partial order 1 or 2 or a partial order obtained by combining two or more partial orders.

Figure 4:
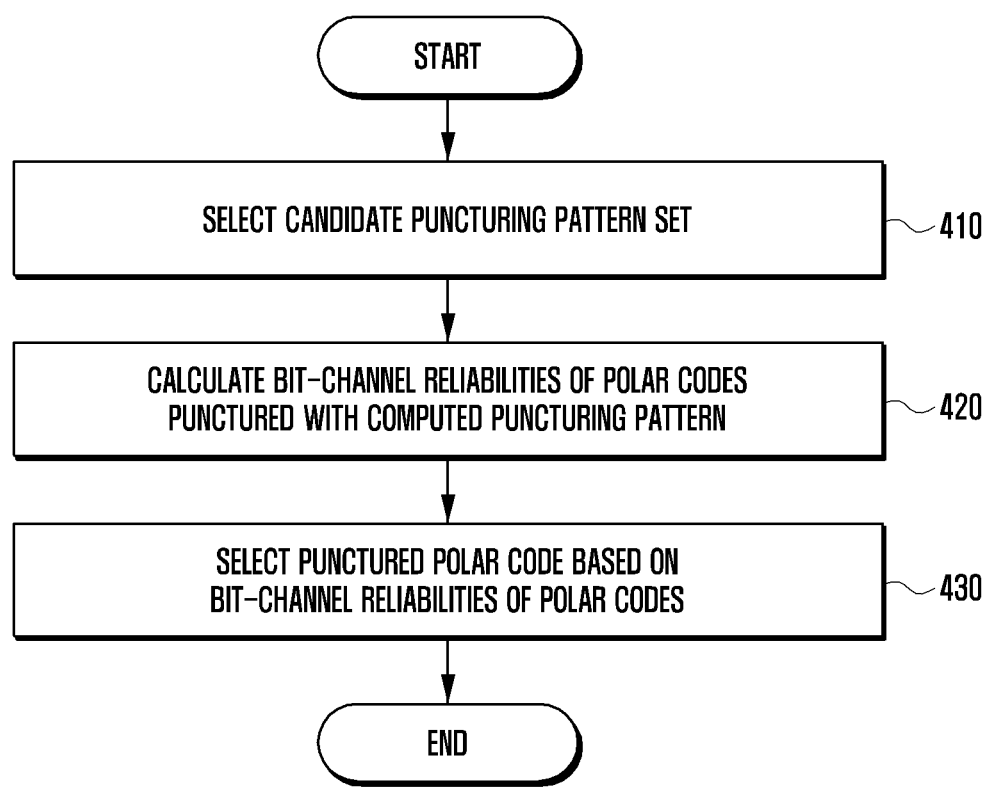
FIG. 4 is a flowchart illustrating a punctured polar code design procedure according to an embodiment of the disclosure.

FIG. 4 is a flowchart illustrating a punctured polar code design procedure according to an embodiment of the disclosure.

Figure 5:
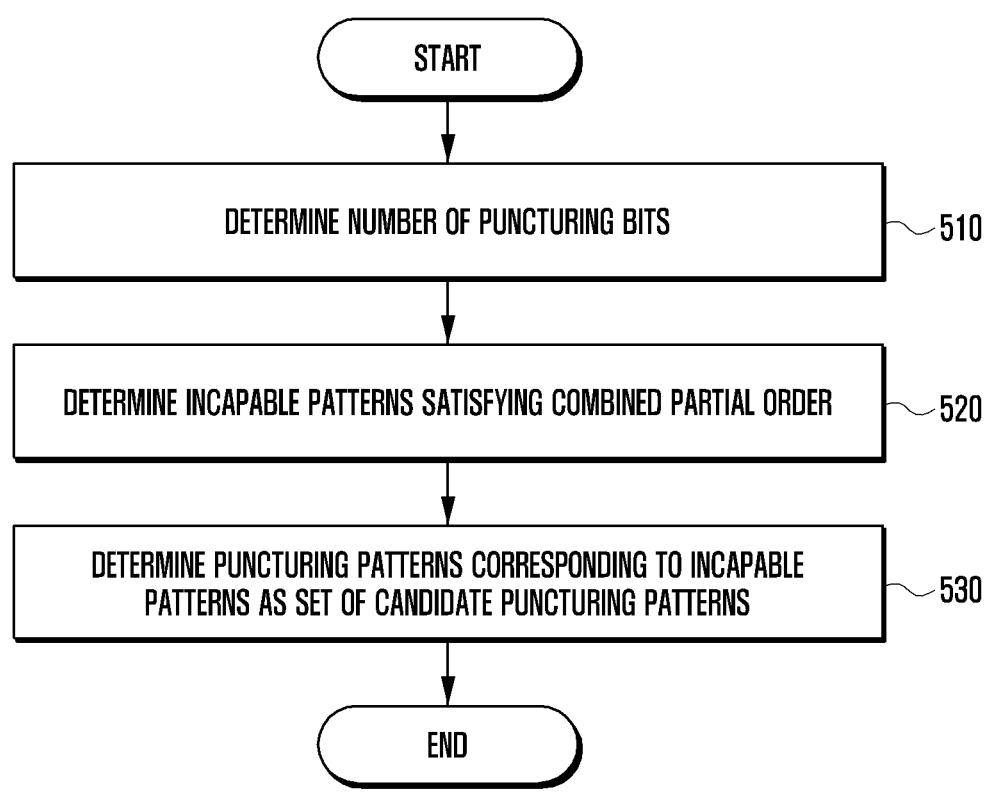
FIG. 5 is a flowchart illustrating an operation of selecting a set of candidate puncturing patterns according to an embodiment of the disclosure.

Referring to FIG. 5, a transmitter selects a set of candidate puncturing patterns at operation 410. The candidate puncturing pattern set is selected in such a way of computing incapable patterns and symmetric puncturing patterns corresponding to the incapable patterns as described above, and the selection procedure is described in more detail with reference to FIG. 5.

At operation 420, the transmitter calculates bit-channel reliabilities of the puncturing patterns belonging to the candidate puncturing pattern set. Bit-channel reliability may be computed through a method, but is not limited to such a method, of selecting an expected value of bit-error rate (BER) of a bit-channel using, but not being limited to using, a density evolution (DE) technique.

At operation 420, the transmitter may select a puncturing pattern in which the sum of K least bit-channel reliabilities is least (i.e., average BER is low) among the puncturing patterns belonging to the candidate puncturing pattern set. Here, an information set may be selected with K indices having the least bit-channel reliability. In this manner, it is possible to design a punctured polar code with the optimal puncturing pattern selected based on the bit-channel reliability, and the transmitter may encode information bits at operation 430 using the information set selected together.

FIG. 5 is a flowchart illustrating an operation of selecting a set of candidate puncturing patterns according to an embodiment of the disclosure. FIG. 5 shows in detail a detailed candidate puncturing pattern set selection operation of 410 in FIG. 4.

Referring to FIG. 5, the transmitter determines, at operation 510, a number of puncturing bits and, at operation 520, incapable patterns satisfying a combined partial order among all incapable patterns being determined based on the number of puncturing bits. The number of incapable patterns satisfying the combined partial order varies according to length N of the polar code and the number of puncturing bits p. This process of determining incapable patterns satisfying the combined partial order may be performed in such a way of selecting the incapable patterns satisfying both partial orders 1 and 2 simultaneously or selecting incapable patterns satisfying partial order 2 (or partial order 1) and then finally selecting incapable patterns satisfying partial order 1 (or partial order 2) among the incapable patterns satisfying partial order 2 (or partial order 1). It may of course be possible to determine an incapable pattern based on each of the individual partial orders as described above.

After determining incapable patterns satisfying the combined partial order (or individual partial order), the transmitter determines, the puncturing patterns corresponding to (symmetric with, reciprocal with, or associated with) the incapable patterns as a candidate puncturing pattern set. The puncturing patterns belonging to the candidate puncturing pattern set may have one-to-one relationships with the combined partial orders. Once the candidate puncturing pattern set is determined, a best puncturing pattern for a punctured polar code is determined through the bit-channel-based reliability computation process described with reference to FIG. 4.

FIG. 6 is a diagram illustrating a table exemplifying a number of incapable patterns satisfying a combined partial order for use in designing punctured polar codes according to an embodiment of the disclosure.

The number of incapable patterns satisfying a combined partial order varies according to length N of a polar code and a number of puncturing bits p. Referring to FIG. 6, when the number of puncturing bits is 64 for a polar code of length 256, the number of incapable patterns is 13754, which is noticeably meaningful from a full search possibility viewpoint in comparison with the enormous number of incapable patterns with no consideration of combined partial orders.

FIG. 7 is a diagram illustrating a table exemplifying bit-channel reliabilities of polar codes punctured with symmetric puncturing patterns computed through a punctured polar code design procedure according to an embodiment of the disclosure.

FIG. 7 shows a result of a comparison between the sum of K minimum bit-channel error probabilities of a (proposed) puncturing pattern selected as described in the above embodiment and the sum of K minimum bit-channel error probabilities of a puncturing pattern selected with a QUP pattern of the related art.

Figure 8:
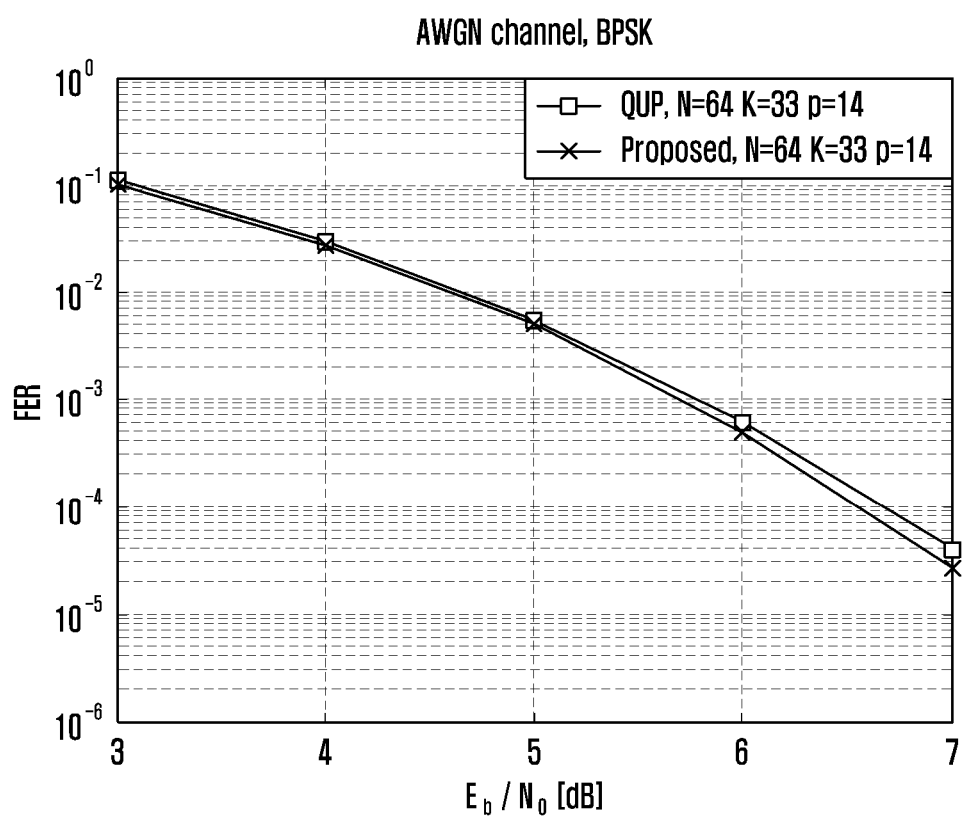
FIG. 8 is a diagram illustrating a graph for explaining a successive cancellation (SC) decoding performance of polar codes designed according to an embodiment of the disclosure.
Figure 9:
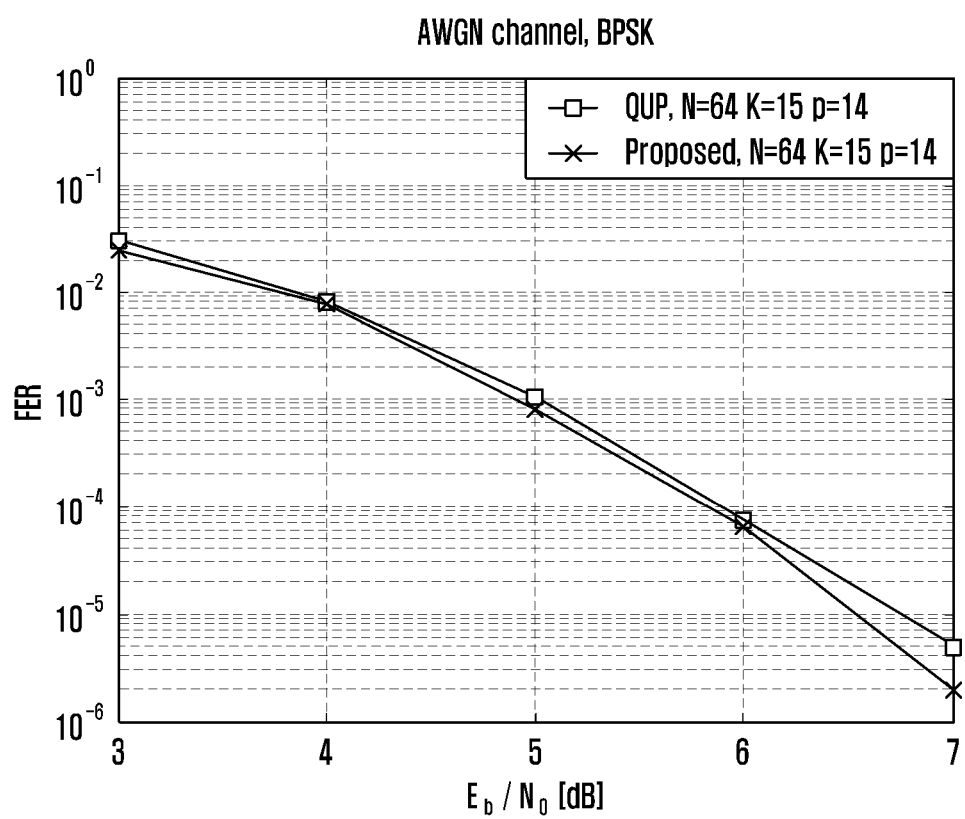
FIG. 9 is a diagram illustrating a graph for explaining an SC decoding performance of polar codes designed according to an embodiment of the disclosure.
Figure 10:
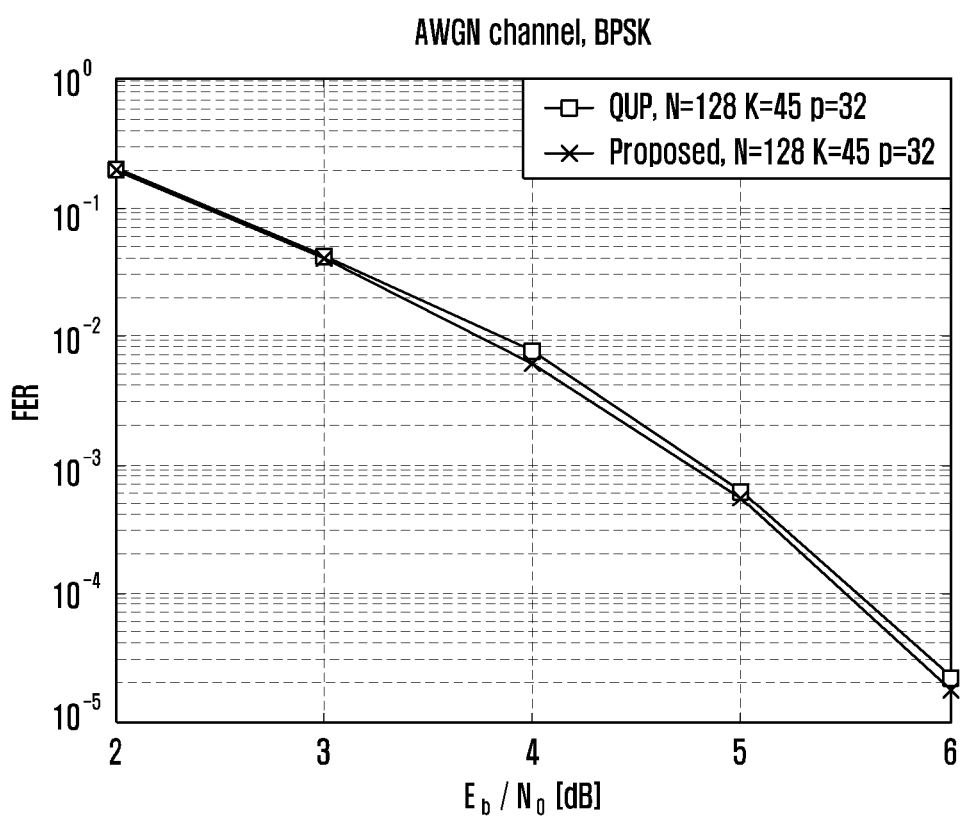
FIG. 10 is a diagram illustrating a graph for explaining an SC decoding performance of polar codes designed according to an embodiment of the disclosure.

FIGS. 8 to 10 are diagrams illustrating graphs for explaining error rate performances of a polar code punctured with a QUP pattern and a punctured polar code designed according to various embodiments of the disclosure; the graphs are depicted for performance comparisons under conditions mentioned for exemplifying the reliabilities of polar codes. The simulation result shows that the punctured polar code designed according to a proposed embodiment is superior in performance to the polar code punctured with the QUP pattern.

By selecting the symmetric puncturing patterns corresponding to incapable patterns satisfying a combined partial order as a set of candidate puncturing patterns, it becomes possible to design punctured polar codes efficiently and guarantee an error rate performance equal to or better than that of the polar code punctured with a QUP, resulting in expectation of performance enhancement along with polar code design efficiency.

As described above, the proposed method is capable of designing punctured polar codes in such a way of making a full search of incapable patterns satisfying a combined partial order (or individual partial order) and selecting symmetric puncturing patterns corresponding to the incapable patterns as a set of candidate puncturing patterns. The punctured polar codes designed according to the proposed method are capable of achieving superiority in error rate performance of successive cancellation (SC) decoding in comparison with the polar codes punctured with the QUP pattern of the related art by selecting the best puncturing pattern and information set based on the bit-channel reliability of the polar code punctured with a puncturing pattern belonging to the selected candidate puncturing pattern set.

Figure 11:
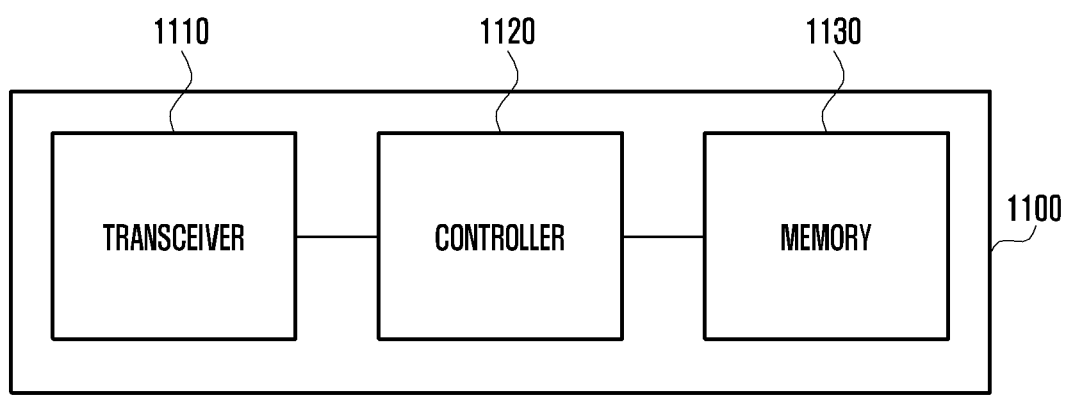
FIG. 11 is a block diagram illustrating a configuration of a transmitter according to an embodiment of the disclosure.

FIG. 11 is a block diagram illustrating a configuration of a transmitter according to an embodiment of the disclosure.

Referring to FIG. 11, the transmitter 1100 (e.g., a terminal) may include a transceiver 1110, a controller 1120, and a memory 1130. The controller 1120 may be implemented as a circuit, an application-specific integrated circuit, or at least one processor. The transmitter 1100 may be an encoding device responsible for encoding.

The transceiver 1110 communicates signals with a network entity. The transceiver 1110 may be implemented in the form of a radio frequency (RF) unit including a modem or implemented with a transmission unit and a reception unit separated from each other. The controller 1120 may control overall operations of the transmitter according to the above described embodiments. For example, the controller 1120 may encode information bits with a polar code to produce coded bits. The memory 1130 may store and organize information being transmitted and received by the transceiver 1110 and information generated by the controller 1120.

Figure 12:
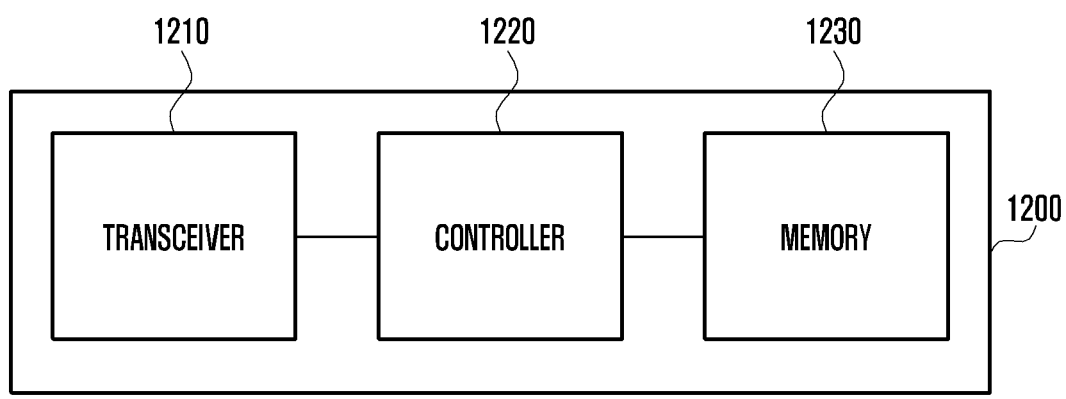
FIG. 12 is a block diagram illustrating a configuration of a receiver according to an embodiment of the disclosure.

FIG. 12 is a block diagram illustrating a configuration of a receiver according to an embodiment of the disclosure.

Referring to FIG. 12, the receiver 1200 (e.g., a base station) may include a transceiver 1210, a controller 1220, and a memory 1230. The controller 1220 may be implemented as a circuit, an application-specific integrated circuit, or at least one processor. The receiver 1200 may be a decoding device responsible for decoding.

The transceiver 1210 communicates signals with a network entity. The transceiver 1210 may be implemented in the form of an RF unit including a modem or implemented with a transmission unit and a reception unit separated from each other. The controller 1220 may control overall operations of the receiver according to the above described embodiments. For example, the controller 1220 may decode received signals to recover transmitted information bits. The memory 1230 may store and organize information being transmitted and received by the transceiver 1210 and information generated by the controller 1220.

The transmitter 1100 and receiver 1200 may respectively correspond to a terminal and a base station communicating signals to each other. For example, the transmitter and the receiver may respectively be a base station and a terminal for downlink transmission or respectively be a terminal and a base station for uplink transmission. The transmitter and the receiver may also be two different terminals communicating with each other.

As described above, the punctured polar code design method of the disclosure is advantageous in terms of facilitating design of punctured polar codes with superior performances by providing criteria for selecting a puncturing pattern candidate selection, a puncturing pattern, and an information set. The punctured polar code design method of the disclosure is also advantageous in terms of facilitating design of punctured polar codes with a superior SC decoding performance.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a transmitter in a wireless communication system, the method comprising:
identifying an incapable pattern based on a number of puncturing bits;
identifying a set of candidate puncturing patterns associated with the incapable pattern;
identifying a bit-channel reliability of the transmitter in the wireless communication system;
selecting a puncturing pattern from the set of candidate puncturing patterns based on the identified bit-channel reliability;

selecting an information set based on the identified bit-channel reliability;

encoding an information bit with the puncturing pattern and the information set; and transmitting, to a receiver, the encoded information bit.

2. The method of claim 1, wherein the identifying of the incapable pattern comprises selecting the incapable pattern based on satisfying a combined partial order or selecting the incapable pattern based on satisfying a single partial order.

3. The method of claim 2, wherein the selecting of the incapable pattern satisfying the combined partial order comprises:

identifying a set of incapable patterns that satisfy a first partial order; and identifying the incapable pattern from the set of incapable patterns based on satisfying a second partial order.

4. The method of claim 2, wherein the selecting of the incapable pattern comprises:

identifying a set of incapable patterns based on the number of puncturing bits; and selecting the incapable pattern based on satisfying the combined partial order.

5. The method of claim 1, wherein the puncturing pattern comprises a symmetric puncturing pattern having a reciprocal relationship with the incapable pattern, and wherein the reciprocal relationship comprises a one-to-one relationship.

6. The method of claim 1, wherein the selecting of the puncturing pattern comprises selecting the puncturing pattern having a sum of reliabilities of least bit-channels computed with a density evolution technique that is lowest, and wherein the selecting of the information set comprises identifying the information set with indices of bit-channels constituting the sum of the reliabilities of the least bit-channels.

7. The method of claim 6, wherein the encoding of the information bit comprises:

encoding the information bit with the information set to generate an encoded bit; and puncturing the encoded bit with the puncturing pattern.

8. A transmitter in a wireless communication system, the transmitter comprising:

a transceiver configured to transmit and receive signals; and a controller coupled with the transceiver and configured to:

identify an incapable pattern based on a number of puncturing bits, identify a set of candidate puncturing patterns associated with the incapable pattern, identify a bit-channel reliability of the transmitter in the wireless communication system, select a puncturing pattern from the set of candidate puncturing patterns based on the identified bit-channel reliability, select an information set based on the identified bit-channel reliability, encode an information bit with the puncturing pattern and the information set, and transmit, to a receiver, the encoded information bit.

9. The transmitter of claim 8, wherein the controller is further configured to select the incapable pattern based on satisfying a combined partial order or select the incapable pattern based on satisfying a single partial order.

10. The transmitter of claim 9, wherein the controller is further configured to:

identify a set of incapable patterns that satisfy a first partial order, and identify the incapable pattern from the set of incapable patterns based on satisfying a second partial order.

11. The transmitter of claim 9, wherein the controller is further configured to:

identify a set of incapable patterns based on the number of puncturing bits, and select the incapable pattern based on satisfying the combined partial order.

12. The transmitter of claim 8, wherein the puncturing pattern comprises a symmetric puncturing pattern having a reciprocal relationship with the incapable pattern, and wherein the reciprocal relationship comprises a one-to-one relationship.

13. The transmitter of claim 8, wherein the controller is further configured to:

select the puncturing pattern having a sum of reliabilities of least bit-channels computed with a density evolution technique that is lowest, and identify the information set with indices of bit-channels constituting the sum of the reliabilities of the least bit-channels.

14. The transmitter of claim 13, wherein the controller is further configured to control to:

encode the information bit with the information set to generate an encoded bit, and puncture the encoded bit with the puncturing pattern.

15. A first apparatus of a wireless communication system, the apparatus comprising:

a transceiver configured to transmit and receive signals; and a controller coupled with the transceiver and configured to:

generate an information bit, identify a bit-channel reliability of the apparatus in the wireless communication system, encode the information bit to generate a coded bit, puncture the coded bit with a puncturing pattern to generate a punctured bit, and transmit, to a second apparatus, the punctured bit, wherein the puncturing pattern satisfies a partial order obtained by combining a first partial order and a second partial order that is identified based on a binary representation relationship of bit-channel indices or satisfies a single partial order.

16. The first apparatus of claim 15, wherein the first partial order is identified based on a bit position of 1 in the binary representation relationship, and wherein the second partial order is identified based on a bit position of 0 in the binary representation relationship.

17. The first apparatus of claim 15, wherein the controller is further configured to identify a bit-channel reliability of the apparatus in the wireless communication system, wherein the puncturing pattern is identified from a set of candidate puncturing patterns based on a number of puncturing bits, wherein the set of candidate puncturing patterns are related to an incapable pattern, and wherein the puncturing pattern is selected from the set of candidate puncturing patterns based on the identified bit-channel reliability.

18. The first apparatus of claim 17,
wherein the set of candidate puncturing patterns comprises a symmetric puncturing pattern having a reciprocal relationship with the incapable pattern, and
wherein the reciprocal relationship comprises a one-to-one relationship.

19. The first apparatus of claim 17, wherein the puncturing pattern has a lowest sum of reliabilities of least bit-channels computed with a density evolution technique.

20. The first apparatus of claim 19, wherein the controller is further configured to:
identify an information set with indices of bit-channels when the sum of the reliabilities of the least bit-channels becomes lowest, and
encode the information bit based on the information set to generate the coded bit.

* * * * *

UNITED STATES PATENT AND TRADEMARK OFFICE
CERTIFICATE OF CORRECTION

PATENT NO. : 10,951,242 B2  
APPLICATION NO. : 16/453097  
DATED : March 16, 2021  
INVENTOR(S) : Min Jang et al.

Page 1 of 1

It is certified that error appears in the above-identified patent and that said Letters Patent is hereby corrected as shown below:

On the Title Page

Item (73) The name of the Assignee 2 is not correct. "POSTECH ACADEMY-INDUSTRY FOUNDATION 2." should read "POSTECH ACADEMY-INDUSTRY FOUNDATION".

Signed and Sealed this  
Twenty-seventh Day of April, 2021

Drew Hirshfeld  
*Performing the Functions and Duties of the*  
*Under Secretary of Commerce for Intellectual Property and*  
*Director of the United States Patent and Trademark Office*